United States Patent [19]

Hirukawa et al.

[11] Patent Number: 5,408,083
[45] Date of Patent: Apr. 18, 1995

[54] METHOD OF MEASURING THE BEST FOCUS POSITION HAVING A PLURALITY OF MEASURING MARK IMAGES AND A PLURALITY OF FOCUS POSITIONS

[75] Inventors: Shigeru Hirukawa, Kashiwa; Eiji Takane, Tokyo, both of Japan

[73] Assignee: Nikon Corporation, Tokyo, Japan

[21] Appl. No.: 180,070

[22] Filed: Jan. 11, 1994

[30] Foreign Application Priority Data

Jan. 13, 1993 [JP] Japan .................................. 5-004390

[51] Int. Cl.⁶ .............................................. G01J 1/20
[52] U.S. Cl. ...................................... 250/201.2; 355/53
[58] Field of Search ............... 250/201.2, 201.5, 201.6, 250/201.8, 548, 201.4; 356/400, 401; 355/53, 54, 55, 56

[56] References Cited

U.S. PATENT DOCUMENTS

| | | | |
|---|---|---|---|
| 4,558,949 | 12/1985 | Uehara et al. | 356/152 |
| 4,650,983 | 3/1987 | Suwa | 250/204 |
| 4,677,301 | 6/1987 | Tanimoto et al. | 250/548 |
| 4,908,656 | 3/1990 | Suwa et al. | 355/53 |
| 5,286,963 | 2/1994 | Torigoe | 250/201.2 |
| 5,343,270 | 8/1994 | Sakakibara et al. | 355/53 |

*Primary Examiner*—David C. Nelms
*Assistant Examiner*—Que T. Le
*Attorney, Agent, or Firm*—Shapiro and Shapiro

[57] ABSTRACT

Disclosed is a method of calculating the best focus position of a projection optical system by arranging a photosensitive substrate in the best focus position of a projection optical system, projecting measuring mark images in a plurality of focus positions on the photosensitive substrate in an optical-axis direction of the projection optical system to projection-expose mask patterns and thus obtaining the best focus position from a relationship between each of the focus positions and the measuring mark image corresponding thereto. The method comprises a first step of approximating a size of the measuring mark image with an nth-order or larger (n is an integer of 2 or larger) function relative to the focus position by a statistical operation. The method also comprises a second step of obtaining a tentative best focus position from the approximated function and a third step of calculating a weight corresponding to each of the plurality of measuring mark images on the basis of a difference between the tentative best focus position and each of the plurality of focus positions. The method further comprises a fourth step of approximating a size of the measuring mark image with an nth-order or smaller function relative to the focus position by a statistical operation to minimize a sum, relative to the focus position, of product of the weight obtained in the third step by a square of a difference between the nth-order or smaller function relative to the focus position and the size of the measuring mark image corresponding thereto and a fifth step of obtaining the best focus position of the projection optical system from the nth-order or smaller function obtained in the fourth step.

10 Claims, 8 Drawing Sheets

METHOD OF MEASURING THE BEST FOCUS POSITION HAVING A PLURALITY OF MEASURING MARK IMAGES AND A PLURALITY OF FOCUS POSITIONS

BACKGROUND OF THE INVENTION

1. Field of the Invention

The present invention relates to a method of measuring the best focus; position, which is suitable for an application to a case of setting a focus position of a photosensitive substrate with respect to a projection optical system in a projection exposure apparatus employed when manufacturing, e.g., a semiconductor element, a liquid crystal display element or a thin-film magnetic head, etc. by a lithography step.

2. Related Background Art

A projection exposure apparatus is employed for manufacturing, e.g., the semiconductor element, the liquid crystal display element or the thin-film magnetic head, etc. by the lithography step. The projection exposure apparatus exposes pattern images of a photomask or a reticle (hereinafter collectively termed a [reticle]) on a photosensitive substrate through a projection optical system. In this type of projection exposure apparatus, the pattern images of the reticle are exposed on the photosensitive substrate with a high resolving power. For this purpose, the exposure is required to be done in such a manner that a focus position of an exposure face (e.g., the surface) of the photosensitive substrate, i.e., a position in the optical axis direction of the projection optical system is aligned with the best focus position, i.e., a position of the best imaging plane of the projection optical system. It is required therefor that the best focus position of the projection optical system be previously obtained by some method.

According to a known method of measuring the best focus position, as disclosed in, e.g., U.S. Pat. No. 4,908,656, the best focus position is obtained by a so-called test print in which images of focus measuring marks formed on the reticle are exposed on the photosensitive substrate while shifting a focus position. In the method of thus performing the test print, for instance, a focus measuring mark image 19P as shown in FIG. 1 is exposed on a wafer defined as a photosensitive substrate coated with a photosensitive substance while shifting the focus position. This focus measuring mark image 19P is configured such that a pattern group consists of four pieces of elongate rhombic patterns arranged at a predetermined pitch in a widthwise direction, and a plurality of pattern groups are further arranged at a pitch of 8 $\mu$m.

Thereafter, the focus measuring mark image 19P after developing the wafer is transformed into resist patterns exhibiting a ruggedness. Then, a length (mark length) of each mark image 19P is measured. In this case, when the exposure face of the wafer is located in the best focus position, a length L of the focus measuring mark image 19P reaches the maximum. It is therefore possible to obtain the best focus position by measuring the mark length of the mark image 19P.

Measuring the mark length thereof has hitherto involved the following steps. An area in the vicinity of each mark image 19P is irradiated sheetwise with coherent laser beams. A wafer stage is driven while monitoring a position of the wafer stage mounted with the wafer by use of a laser interferometer. Relative scanning of the laser beam on each mark image is thus effected. When the laser beam exists on the mark image 19P, a diffracted beam or a scattered beam is produced from the mark image 19P in a predetermined direction. A length at which the diffracted beam or scattered beam is detected is measured as a mark length of the mark image 19P in the relevant focus position.

Then, the mark length has hitherto been simply approximated as a biquadratic function or thereabouts by a least squares method. A focus position in which the function comes to the maximum value within a measuring range is set as the best focus position.

When measuring a size of the focus measuring mark image by use of coherent beams such as the laser beams as done in the prior arts, an intensity of a detection signal which is obtained by photoelectrically converting the beams from the mark image varies depending on a profile of the mark image. Accordingly, it happens that the mark length is measured larger or smaller than an actual mark length, depending on a degree of interference of the beams from the mark image. A further drawback is that the calculated best focus position largely shifts due to an exposure quantity or a thickness of a resist film applied on the wafer when effecting the exposure.

For example, FIG. 2 shows a result of approximating the mark length actually measured by the conventional method with a biquadratic function of a focus position F. Referring to FIG. 2, a curve 29 corresponds to a function for approximating the mark length obtained by shifting the focus position at a pitch of 0.3 $\mu$m when an exposure energy is a fiducial energy. A curve 30 corresponds to an approximation function when the exposure energy is smaller by 10% than the fiducial energy. A curve 31 corresponds to an approximation function when the exposure energy is larger by 10% than the fiducial energy. Referring again to FIG. 2, if, for example, the exposure energy is larger by 10% than the fiducial energy, as seen from the curve 31, measurement data of the mark length contains data of particularly a large value. Hence, if a peak position of the curve 31 is simply conceived as the best focus position, the calculated best focus position largely deviates from the true best focus position, resulting in an error in terms of measurement.

Further, in the case of FIG. 2, an exposure time of the focus measuring mark image is changed. When shifting such a focus position that the measurement error of the mark length due to the interference by the laser beams becomes plus (+) and such a focus position that the measurement error becomes minus (−), the best focus position obtained by the conventional method shifts by the order of 0.1 $\mu$m from the one in FIG. 2. Besides, the approximate curve is to be obtained even in the state where the exposure energy is larger by 10% than the fiducial energy by eliminating the data of the mark length extraordinarily larger than the one in FIG. 2. Obtained in this case are biquadratic approximation functions expressed by curves 29A-31A as shown in FIG. 3. According to characteristics of FIG. 3, however, a fluctuation width of the best focus position with respect to the changes in the exposure energy is on the order of 0.6 $\mu$m. No stable measurement result is consequently obtained.

Moreover, if the intensity of the detection signal from the focus measuring mark image decreases in the conventional example, noises intrinsic to a measuring sensor disorders the detection signal. It may happen that the size of the mark image is measured remarkably long in some cases. This conduces to a drawback in which the best focus position is miscalculated or alternatively can not be calculated.

SUMMARY OF THE INVENTION

It is a primary object of the present invention, which has been devised under such circumstances, to provide a best focus position calculating method capable of calculating stably accurately the best focus position without depending on exposure conditions and measuring conditions when obtaining the best focus position with respect to a projection optical system through a test print.

To accomplish the above object, according to one aspect of the present invention, there is provided a best method of calculating the best focus position of a projection optical system (PL) by empirically projecting measuring mark images (19P) on a photosensitive substrate (W) in a plurality of focus positions of the photosensitive substrate (W) to expose mask patterns on the photosensitive substrate (W) set in the best focus position of the projection optical system (PL) through this projection optical system (PL) and thus calculating the best focus position thereof from a relationship between each focus position and the measuring mark image (19P) corresponding thereto. The method comprises a first step (step 108) of approximating a size of the measuring mark image (19P) with an nth-order or larger (n is an integer of 2 or larger) function relative to the focus position corresponding thereto by a statistical operation, e.g., a least squares method. The method also comprises a second step (step 110) of obtaining the tentative best focus position F2 from the thus approximated function.

Further, the method according to the present invention comprises a third step (step 111) of calculating a weight for each focus position on the basis of a difference between the tentative best focus position F2 and each focus position. The method also comprises a fourth step (step 112) of approximating the size of the measuring mark image (19P) with an nth-order or smaller function relative to the focus position thereof by the statistical operation, e.g., the least squares method. The method further comprises a fifth step (step 114) of obtaining the best focus position of the projection optical system (PL) from the nth-order or smaller function obtains in the fourth step.

In this case, in the second step, a first threshold value is determined with respect to the nth-order or larger function obtained in the first step. An intermediate position F2 between positions in which the nth-order or larger function intersects the first threshold value is set as the tentative best focus position. In the fifth step, a second threshold value is determined with respect to the nth-order or smaller function obtained in the fourth step. An intermediate position F4 between positions in which the nth-order or smaller function intersects the second threshold value may be set as the best focus position of the projection optical system (PL).

Further, the nth-order or larger function obtained in the first step is a biquadratic or larger function relative to each focus position. The nth-order or smaller function obtained in the fifth step is desirably biquadratic or smaller function relative to each focus position.

Moreover, in the first step, it is desirable that the measuring mark images (19P) having their sizes in excess of a predetermined range be not employed for obtaining the nth-order or larger function.

The present invention described above has been devised from the following viewpoints.

(1) When approximating the size of the measuring mark image with the function relative to the focus position by the least squares method, it is permitted that an error in the vicinity of the best focus position is smaller than an error between an actually measured value and an approximate value in such a focus position that a difference (focus difference) from the best focus position is comparatively large. An approximate accuracy in the vicinity of the best focus position in an approximate expression is further enhanced. This is attained by applying a small weight to the square of the error, e.g., in the focus position apart from the best focus position in the third step (step 111) and the fourth step (step 112) when obtaining a sum of the square of the error by the least squares method.

(2) For this purpose, there is at first performed a preprocess for temporarily determining where the best focus position in the first step (step 108) and the second step (step 110). In this preprocess, the approximate order increases up to the nth-order or larger to substantially accurately obtain the relationship of the size of the focus measuring mark image versus the focus position. This is intended to provide a difficulty to undergo an influence of variations due to the interference or the like of the detecting light beams from the focus measuring mark image in a defocus area.

(3) However, the order in the approximate expression by the least squares method is too high. Therefore, the order in the approximate expression for obtaining the best focus position eventually decreases down to the nth-order or smaller in the fourth step (step 112). This is done so that the approximate expression based on the least squares method does not follow the variations in the size of the focus measuring mark image due to the interference or the like of the detecting light beams. Generally, there are (n−1) points of inflection of the nth-order or smaller function at the maximum. Hence, a point-of-inflection number in a graph of the approximate expression is reduced by decreasing the order in the approximate expression. The sizes of the focus measuring mark images are expressed in the form of a simpler graph with respect to the focus position. Accordingly, micro-errors caused by the interference or the like are eliminated by decreasing the order in the approximate expression.

(4) The best focus position is set in a focus position where the approximation function takes the maximum or minimum value. Obtained in such a case is the focus position in which a differential value relative to the focus position of this approximation function becomes 0. In this instance, there also shifts the position in which the differential value of the approximation function becomes 0 due to some fluctuations in ambient measurement values. An enhancement of a measuring reproducibility can not be therefore expected. Therefore, the enhancement of the measuring reproducibility desirably requires the following processes. In the second step (step 110) and the fifth step (step 114), there are obtained two focus positions in which the size of the focus measuring mark image comes to a threshold value varied by a predetermine value from the maximum or minimum value. A mid-point therebetween is set as the tentative best focus position and the final best focus position as well. A slope of the curve of the approximation function is large to some extent in such a focus position that the approximation function comes to the threshold value. Even if the measurement value somewhat changes, the slope of the curve of the approximation function in the vicinity thereof is not 0. Accordingly, the central position thereof can be comparatively stably obtained, thereby enhancing the measuring reproducibility.

(5) A magnitude of the actually measured value of the size of the focus measuring mark image is larger than the size of the focus measuring mark on the mask and the size of the mark image on the photosensitive substrate which is obtained from a magnification of the projection optical system. This is, it is considered, normally attributed to noises in the measuring system. Therefore, when the size of the focus measuring mark image employed in the first step (step 108) exceeds the size of the mark image which is to be originally transferred, the measurement data thereof is determined as a measurement error due to the influence of the noises in the measuring system. It is desirable that the data be not used for determining the approximation function. With this processing, it follows that only the ordinary data containing no extraordinary value are employed. The influence of the measurement error or the like can be thereby reduced.

(6) According to the present invention, the high-order approximation function is set to the nth-order or larger. The low-order approximation function is set to the nth-order or smaller. When a value of n is 4, however, the best focus position is calculated especially stably and accurately.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

One example of a method of calculating the best focus position according to this invention will hereinafter be described with reference to FIGS. 4–10. In accordance with this embodiment, the present invention is applied to such a case as to obtain the best focus position of a projection optical system in a reduction projection exposure apparatus (stepper).

Figure 4:
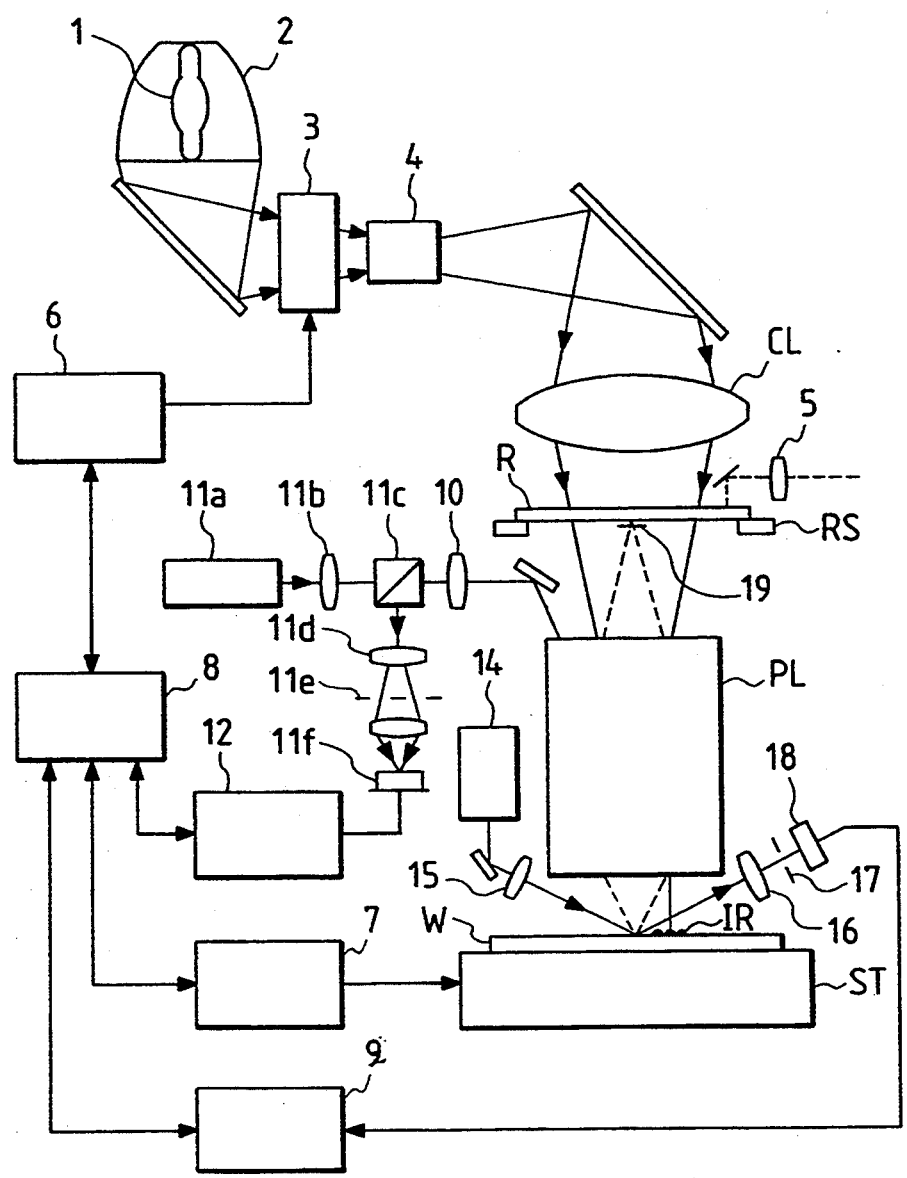
FIG. 4 is a view illustrating one example of a configuration of a stepper according to the present invention.

FIG. 4 illustrates a configuration of the stepper to which the present embodiment is applied. Referring to FIG. 4, beams of light (g-line, i-line, etc.) from a mercury-arc discharge lamp 1 serving as a light source for exposure are condensed by an elliptical mirror 2. Thereafter, the light beams pass through a shutter 3 for regulating an exposure quantity. The light beams which have passed through the shutter 3 are illuminance-uniformed by an optical integrator 4. A reticle R is thereafter illuminated with the uniformed light via a main condenser lens CL. An illumination optical system for exposure extends from the discharge lamp 1 to the main condenser lens CL. Supposing that a light emitting intensity of the discharge lamp 1 is substantially fixed, an open time of the shutter 3 is controlled by a shutter controller 6. A fixed quantity of exposure is thereby obtained at all times. The reticle R is held on a reticle stage RS making micromotions within a two-dimensional plane (in X- and Y-rotational directions). The light beams penetrating a variety of patterns formed in pattern areas on the reticle R are projection-imaged on a wafer W through a projection optical system PL telecentric on the image side (or both sides). The wafer W is mounted on a wafer stage SAT.

The reticle R is initialized based on mark detection signals from a reticle alignment system 5 for photoelectrically detecting alignment marks along the periphery of the reticle R by causing the micromotions of the reticle stage RS. On the other hand, the wafer stage ST mounted with the wafer W are stepped by fixed quantities in the X- and Y-directions. The wafer stage ST thus moves so as to print an image of the pattern area of the reticle R with respect to each shot area (segmented area) on the wafer W. Further, the wafer stage ST also moves when photoelectrically detecting a variety of patterns (alignment marks and resist patterns) on the wafer W. Motions of this wafer stage ST are controlled by a stage controller 7. The stage controller 7 is equipped with a drive motor and a laser interferometer for sequentially measuring coordinate values of the wafer stage ST.

By the way, this kind of stepper is provided with a wafer alignment system for detecting a variety of patterns (alignment marks, etc.) on the wafer W. In accordance with this embodiment, as disclosed in, e.g., U.S. Pat. No. 4,677,301, a wafer alignment system 11 of a TTL (Through-The-Lens) method. Slit-like spot beams are projected on the wafer W through the projection optical system PL. The wafer alignment system 11 detects optical information especially diffracted light and scattered light from the mark patterns irradiated with the spot beams again through the projection optical system 11.

The wafer alignment system 11 includes a laser light source 11a such as an He—Ne laser light source or an Ar ion laser light source. Laser beams from the laser light source 11a penetrate a lens system 11b including a cylindrical lens or the like, a beam splitter 11c and an objective lens 10. The laser beams are deflected by a mirror and travel through the center of an entrance pupil of the projection optical system PL. The laser beams vertically fall on the wafer W from off-axis areas of the projection optical system PL and thus turn out slit-like spot beams extending in one direction on the wafer by an action of the lens system 11b.

Further, the beams returning from the wafer W travel back through the projection optical system PL. The beams are then reflected by the beam splitter 11c via the objective lens 10. The beams are received by a photoelectric converting element 11f after passing through a pupil relay system, a spatial filter 11e and a condenser lens 11e. The spatial filter 11e is disposed in a substantially conjugate relationship with a pupil plane of the projection optical system PL. The spatial filter 11e intercepts a regular reflected beam but transmits a diffracted beam and a scattered beam among the beams returning from the wafer W. Herein, a numerical aperture of the laser beams emerging from the objective lens 10 is determined to provide a comparatively small beam cross-sectional size at the center of pupil of the projection optical system PL. Hence, even when the numerical aperture of the projection optical system PL itself is large, a numerical aperture of the beam reaching the wafer W becomes comparatively small. This implies a difficulty to undergo an influence of defocus when detecting the variety of patterns on the wafer because a focal depth of the beam is large.

Now, photoelectric conversion signals from the photoelectric converting element 11f are inputted to a signal processing system 12. Herein, a position of the mark image is detected based on a waveform corresponding to a profile of the mark image (pattern image). At this time, the signal processing system 12 effects sampling of waveforms of the signals from the photoelectric converting element 11f obtained when making relative movements of the spot beam and the wafer W. This involves the use of position measuring pulses (e.g., one pulse per 0.02 μm) from the laser interferometer in the stage controller 7. In accordance with this embodiment, a position of a resist pattern IR formed on the wafer W is automatically measured by use of the wafer alignment system 11 of the TTL method and the signal processing system 12 as well.

Incidentally, when printing the pattern of the reticle R on the wafer W, the best imaging plane of the projection optical system PL i.e., the plane on which the pattern image of the reticle R is imaged with the best contrast is required to be accurately aligned with the resist surface of the wafer W. For this purpose, this embodiment involves providing an oblique incidence focus detecting system (AF sensor). Beams from a light source 14 non-photosensitive to a resist layer turn out imaging beams through a projection optical system 15. The imaging beams are projected with an inclination (at 5°–20° to the wafer surface) on the wafer W. The reflected beams therefrom are received by a photoelectric detector 18 via a light receiving optical system 16 and a slit 17. In this AF sensor, as disclosed in U.S. Pat. No. 4,558,949 and U.S. Pat. No. 4,650,983, the photoelectric detector 18 outputs a focus signal indicating an in-focus state when the best imaging plane of the projection optical system is aligned with the surface of the wafer W. The photoelectric detector 18 outputs, when the wafer surface deviates in up-and-down (optical axis) directions with respect to the best imaging plane, a focus signal corresponding to a deviation quantity (e.g., within several ±μm) thereof. The focus signals representing the focus and defocus are processed by a focus control unit (hereinafter termed an [AF unit]) 9.

Further, the wafer stage ST is equipped with a Z-stage for micro-moving the wafer W in the optical axis direction of the projection optical system PL. The wafer stage ST is also equipped with a Θ-stage for micro-rotating the wafer W within an XY plane. The Z-stage is driven under control of the stage controller 7 in response to the above focus signals, thereby performing an auto-focusing action. Note that a part of the optical system of the AF sensor or the AF unit 9 incorporates an offset element. The offset element works to shift a surface position of the wafer W in the optical axis directions of the projection optical system PL.

Figure 5:
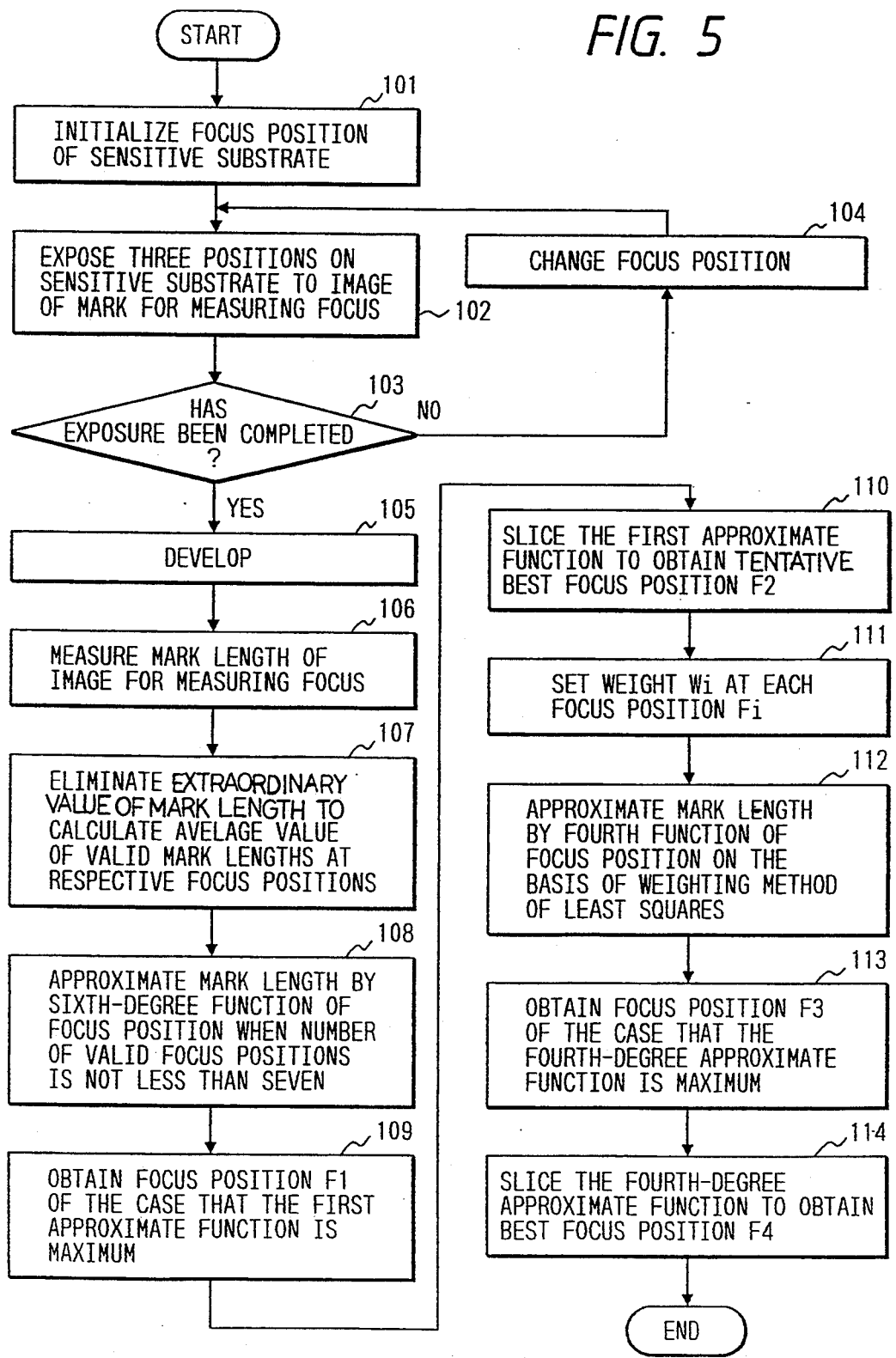
FIG. 5 is a flowchart showing one embodiment of a method of the best focus position according to the present invention.

The following is an explanation of actions to obtain the best focus position with respect to the projection optical system PL in this embodiment in conjunction with a flowchart of FIG. 5. To start with, as shown in FIG. 4, a focus measuring mark 19 is formed on a pattern forming surface of the reticle R in this embodiment.

Figure 6A:
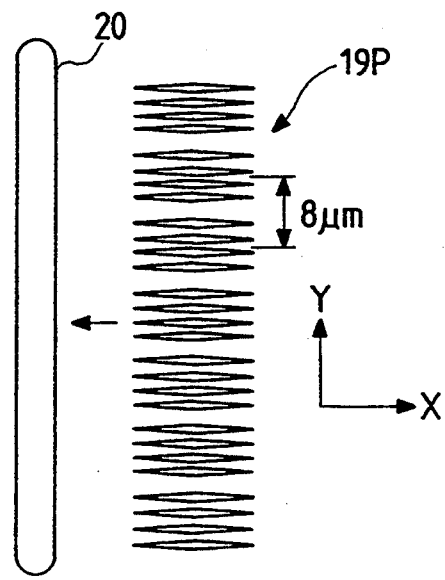
FIG. 6A is an enlarged plan view illustrating a focus measuring mark image exposed on a wafer in the embodiment.

FIG. 6A depicts a mark image 19P obtained by projecting the focus measuring mark 19 on the wafer W. Four rhombic patterns elongated in the X-direction are arranged at a predetermined pitch in the Y-direction, thus forming a pattern unit. A plurality of pattern units are further arranged at a pitch of 8 μm in the Y-direction. The mark image 19P is thus configured. When an exposure face of the wafer W is located in the best focus position in the direction along the optical axis of the projection optical system PL, an X-directional length of the mark image 19P is maximized. The best focus position is obtained as below by making use of this fact.

In step 101 of FIG. 5, the focus position of the wafer W defined as a photosensitive substrate is at first set to an initial value. For instance, with the focus position considered theretofore as the best focus position being centered, the initial value thereof is set in a lower or upper limit position of a range in which the exposure face of the wafer W is moved in a test print of this time. Thereafter, in step 102, the image of the focus measuring mark 19 of the reticle R is exposed on the wafer W as the photosensitive substrate. On this occasion, the wafer stage ST is stepped in the direction perpendicular to the optical axis of the projection optical system PL, thus exposing the pattern of the reticle R. The image of the focus measuring mark 19 is thereby exposed on each of three shot areas in the same focus position.

Thereafter, the action moves from step 103 to step 104, wherein the focus position of the exposure face of the wafer W is shifted by a predetermined step quantity. If the initial value of the focus position of the exposure face of the wafer W reaches the lower limit of the moving range, the focus position gradually rises. Whereas if the initial value thereof reaches the upper limit of the moving range, the focus position gradually lowers. Then, the action moves to step 102. The images of the respective focus measuring marks 19 are exposed on the three unexposed shot areas on the exposure face of the wafer W as the photosensitive substrate. Then, step 104 and step 102 are repeated till the focus position reaches the lower or upper limit of the moving range. When the focus position reaches the upper or lower limit of the moving range, the action moves from step 103 to step 105, wherein the wafer W is developed.

Measured next in step 106 is a mark length, i.e., a length of the focus measuring mark image on the wafer W after being developed.

Figure 6B:
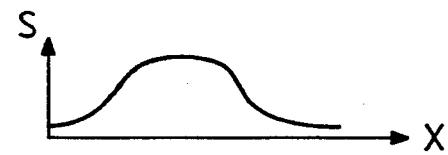
FIG. 6B is a diagram showing a waveform of a detection signal obtained from the mark image of FIG. 6A.

FIG. 6A illustrates the focus measuring mark image 19P as an object for measurement. Referring to FIG. 6A, the laser light source 11a of the wafer alignment system of FIG. 4 emits laser beams. The laser beams in the form of slit-like scan beams 20 elongated in the Y-direction fall on areas in the vicinity of the focus measuring mark image 19P on the wafer W. In this state, the wafer stage ST of FIG. 4 is moved in the (−) X-direction. The focus measuring mark image 19P is irradiated with the slit-like scan beams 20. For a duration of this irradiation, the diffracted beams consequently emerge in a predetermined direction from the mark image 19P. Hereat, the photoelectric converting element 11f of FIG. 4 detects the diffracted beams. Detection signals S outputted from the photoelectric converting element 11f are plotted with respect to X-coordinates of the wafer stage ST. As illustrated in FIG. 6B, the value of the detection signal S increases in an area where the mark image 19P exists in the X-direction. Accordingly, an X-directional length of a range where the detection signal S exceeds a predetermined threshold value can be defined as a mark length of the focus measuring mark image 19P.

The detection signals S are supplied to the signal processing system 12 of FIG. 4. The signal processing system 12 obtains coordinates of two positions in the X-direction when the detection signal S traverses a slice level exhibiting an intensity that is 20% of a fiducial intensity, wherein the fiducial intensity is, for example, the largest intensity of the detection signals obtained from the mark image 19P. The mark length is a coordinate-interval between these two positions. However, this slice level is not limited to 20% of the fiducial intensity.

Figure 7:
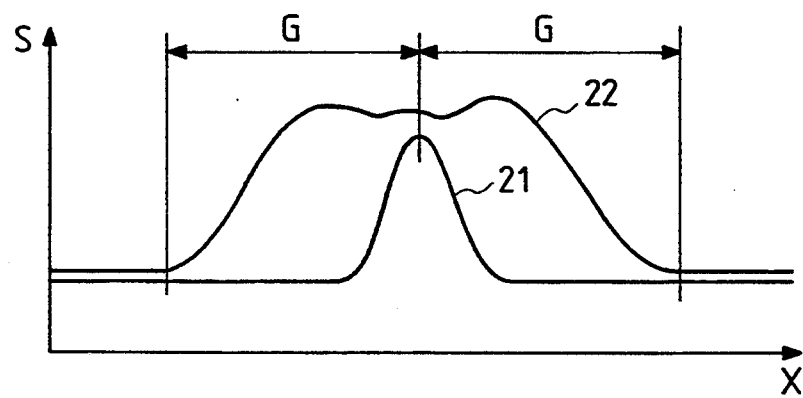
FIG. 7 is an explanatory diagram showing a method of setting a gate in the detection signal obtained from the mark image for measuring the focus in the embodiment.

Further, as illustrated in FIG. 7, the signal processing system 12 sets a gate in a range of an X-directional width 2 G, with a fiducial intensity position being centered with respect to the detection signal S. Only the detection signal S within the gate range is an object for processing. The detection signal S changes from a characteristic expressed by such a curve 21 the mark length comes to approximately 0 μm when defocused to a characteristic expressed by such a curve 22 that the mark length comes to approximately a design value in the best focus position. Accordingly, for corresponding to all of the states, it is required that one-side X-directional width G of the gate during signal processing be opened by a range of 0 to ½ or larger of the mark length with respect to a position in which the signal intensity is maximized.

Thus, the measured results of the respective mark lengths are obtained in the signal processing system 12 of FIG. 4. The measured results are stored together with the corresponding focus position data in a file within a storage device such as a disk device connected to the main control system 8 of FIG. 4. Inputted, in addition, to the file thereof is data of a maximum value of valid mark lengths, the data being employed for eliminating an extraordinary value as will be mentioned later. The data may be inputted by an operator through a keyboard or the like. However, the data read from a different file may also be transferred to that file.

Based on the mark length data read from the file and other data, the main control system 8 of FIG. 4 thereafter calculates the best focus position with respect to the projection optical system PL in the following manner. To start with, in step 107 of FIG. 5, there is made invalid the data about the mark length larger than the valid maximum length among the mark length data read therefrom. Only the data about the mark length equal to or smaller than the valid maximum length is made valid. Thereafter, three pieces of mark length data at the maximum are averaged in each focus position. This averaged result is employed as a measured result of the mark length in each focus position.

Next in step 108, if there are provided seven or more focus positions $F_i$ having the valid mark length data $L_i$ (i=0, 1, 2, ...), the mark length data $L_i$ is approximated by a sextic function of the focus position F according to the least squares method. If there are provided six focus positions having the valid mark length data, the data is approximated by a quintic function. If there are provided five focus positions having the valid mark length data, the data is approximated by a biquadratic function. The approximation functions obtained in step 108 are called first approximation functions. On the other hand, there are provided four or less focus positions having the valid mark length data, this implies a problem in terms of measuring conditions. The calculation of the best focus position ceases. Instead, for instance, the images of the focus measuring marks are again exposed on the wafer W.

Figure 8A:
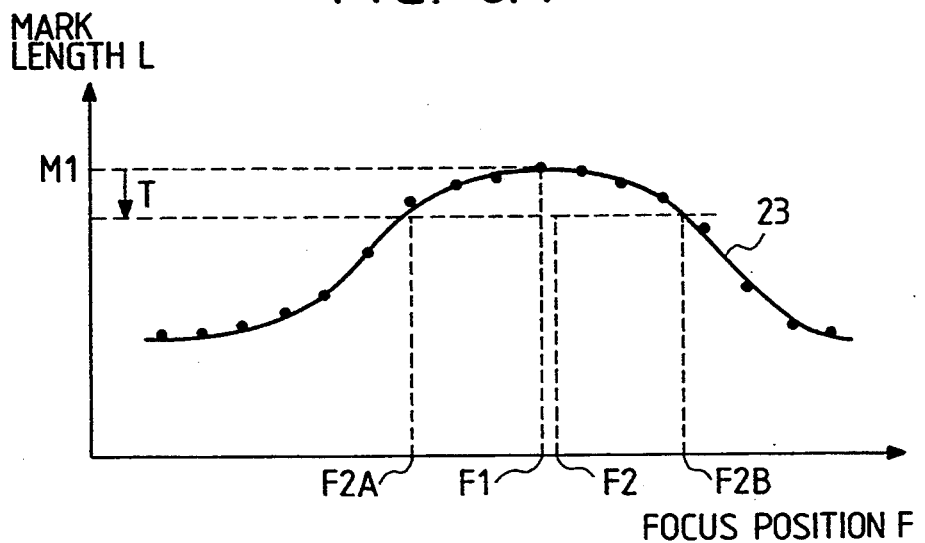
FIG. 8A is a graphic chart showing one example of a approximation function obtained by a first approximation in the embodiment.

FIG. 8A shows one example of a curve 23 corresponding to the first approximation functions obtained by the least squares method in step 108. Obtained subsequently in step 109 is a maximum value M1 of the first approximation functions within a range of the focus positions F having the valid mark length data. A focus position F1 when the first approximation function takes the maximum value M1 is also obtained. Next, a threshold value (M1−T) smaller by a preset slice value T than the maximum value M1 is set in step 110. A (−) side focus position F2A is obtained from the focus position F1 when the first approximation function goes across the threshold value (M1−T). A (+) side focus position F2B is also obtained from the focus position F1. An intermediate (average) focus position F2 between these focus positions F2A and F2B is set as the tentative best focus position.

Thereafter, in step 111, a weight $W_i$ is set on each of the focus positions $F_i$, corresponding to a difference (focus difference) between each of the focus positions $F_i$ and the tentative best focus position F2. The weight $W_i$ in this embodiment is expressed as follows, wherein a dispersion $\sigma$ relative to the focus difference from the tentative best focus position F2 involves the use of a Gaussian function of 1.

$$W_1 = \{1/(2^{\frac{1}{2}}\pi)\}\exp\{-(F2-F_i)^2/2\}$$

Note that the function representing the weight $W_i$ may involve the use of a variety of functions exclusive of the Gaussian function. In this case, the function is not necessarily confined to a monotone decreasing function but may involve the use of such a function that the value increases in an area with a larger slope of the first approximation function which corresponds to, e.g., the curve 23 of FIG. 8A.

Next in step 112, each mark length data $L_i$ is approximated by the biquadratic function of the focus position F according to the weighting least squares method, using the weight $W_i$ obtained in step 111. This implies that a parameter of the biquadratic approximation function is determined to minimize a sum of product of the weight $W_i$ of the corresponding focus position by a square of a residual error between the value of the biquadratic approximation function relative to the focus position and the actually measured mark length data $L_i$.

Figure 8B:
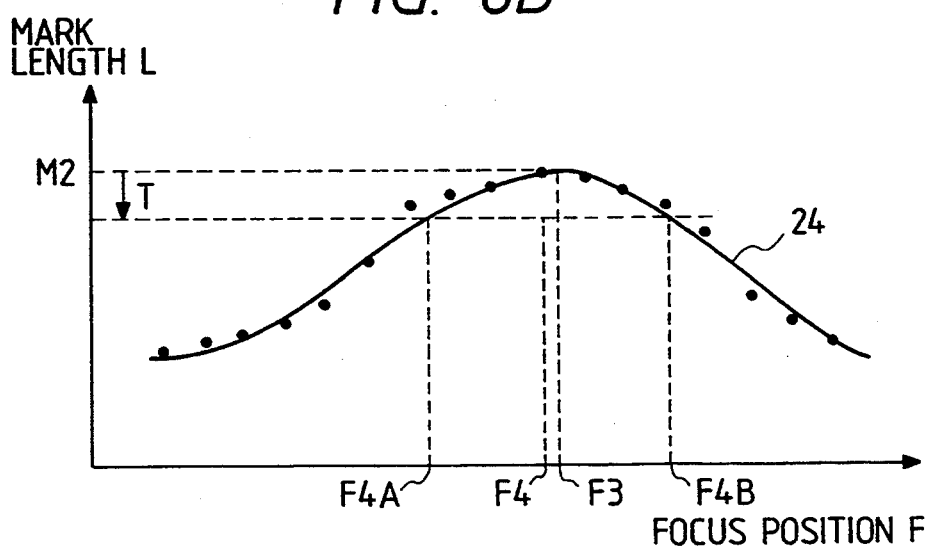
FIG. 8B is a graphic chart showing one example of an approximation function obtained by a second approximation in the embodiment.

FIG. 8B shows one example of a curve 24 corresponding to the biquadratic function obtained in step 112. Thereafter, in step 113, a maximum value M2 of the biquadratic approximation function within the range of the focus positions F having the valid mark length data is obtained. Obtained also is a focus position F3 when the biquadratic approximation function takes the maximum value M2. Next, a threshold value (M2−T) smaller by the preset slice value T than the maximum value M2 is set in step 114. A (−) side focus position F4A is obtained from the focus position F3 when the biquadratic approximation function traverses the threshold value (M2−T). A (+) side focus position F4B is also obtained from the focus position F3. An intermediate (average) focus position F4 between these focus positions F4A and F4B is set as the best focus position to be obtained finally. The best focus position is thus obtained.

Figure 9:
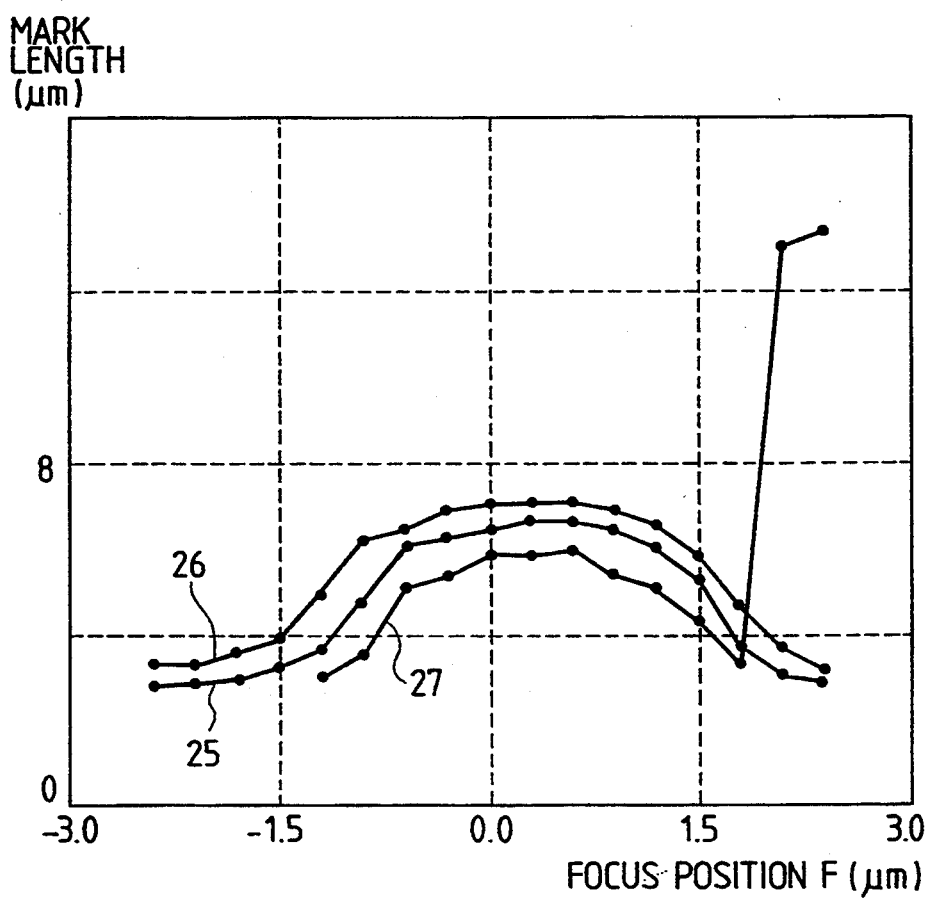
FIG. 9 is a graphic chart showing actually measured values of the mark lengths under each exposure condition in the embodiment.

Shown next is one example of the result of concretely calculating the best focus position by the above method. In this instance, the focus position is shifted at a pitch of 0.3 μm, and, thus, the images of the focus measuring marks are exposed on the wafer. Simultaneously, test printing is performed with a classification of the exposure energy into a fiducial energy, an energy larger by 10% than this fiducial energy and an energy smaller by 10% than the fiducial energy. As depicted in FIG. 9, actually measured value so the mark lengths of the mark images with respect to the respective focus positions are thereby obtained. Referring to FIG. 9, a polygonal line 25 indicates the measured value when exposed with the fiducial energy. A polygonal line 26 indicates the measured value when exposed with the energy smaller by 10% than the fiducial energy. A polygonal line 27 indicates the measured value when exposed with the energy larger by 10% than the fiducial energy. FIG. 9 gives a representation with an omission of the data about the focus positions where the data can not be recorded due to an error of measurement.

Figure 10:
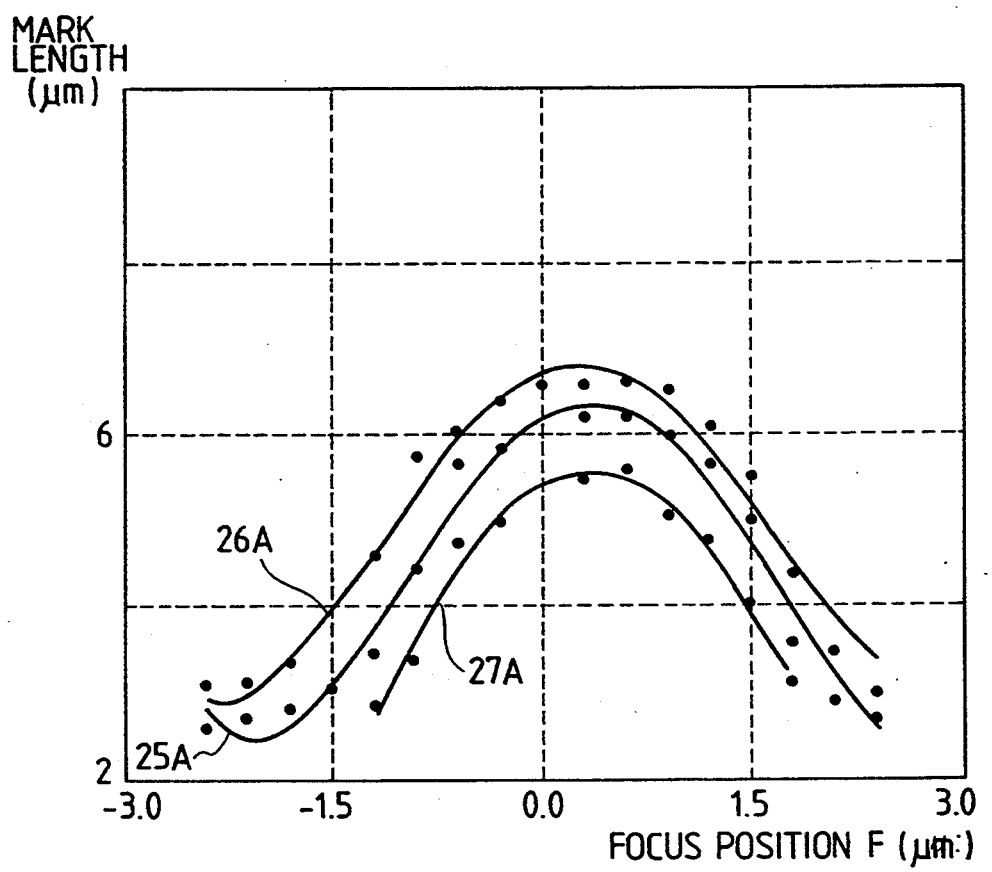
FIG. 10 is a graphic chart showing approximation functions obtained from the actually measured values by the method in the embodiment.

Then, the maximum value of the valid mark lengths when eliminating the extraordinary value is set to 10 μm. The slice value T of FIGS. 8A and 8B is set to 1 μm. As a result of thus obtaining the biquadratic approximate expression as an approximate expression for the second time, there is obtained an approximate expression expressed by curves 25A–27A as shown in FIG. 10. Turning to FIG. 10, the curve 25A represents an approximation curve when exposed with the fiducial energy. The curve 26A represents an approximation curve when exposed with the energy smaller than by 10% than the fiducial energy. The curve 27A represents an approximation curve when exposed with the energy larger than by 10% than the fiducial energy. In this example, the data of the mark length exceeding 10 μm is processed as a measurement error. Hence, as can be understood from FIG. 10, there is caused no large shift phenomenon of the measurement value and no measurement error in the best focus position due to noises of the measuring sensor.

Figure 1:
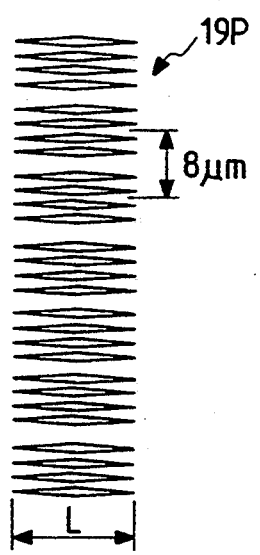
FIG. 1 is a plan view illustrating a mark image for measuring a focus in the prior art.
Figure 2:
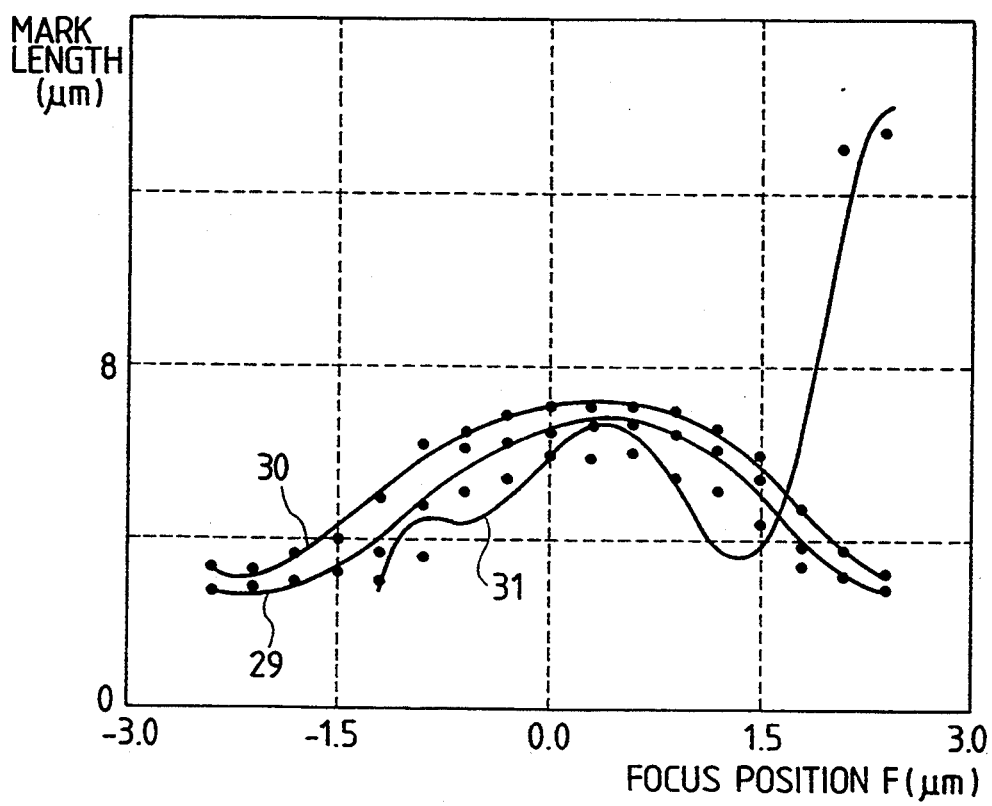
FIG. 2 is a graphic chart showing approximation functions obtained from actually measured values of mark lengths under each exposure condition in a conventional example.

In contrast with this, according to the approximation curve of FIG. 2 that is obtained by the conventional method already explained, the extraordinary value is not removed. Accordingly, the measurement error is produced in a curve 31 with a larger-by-10% exposure energy.

Figure 3:
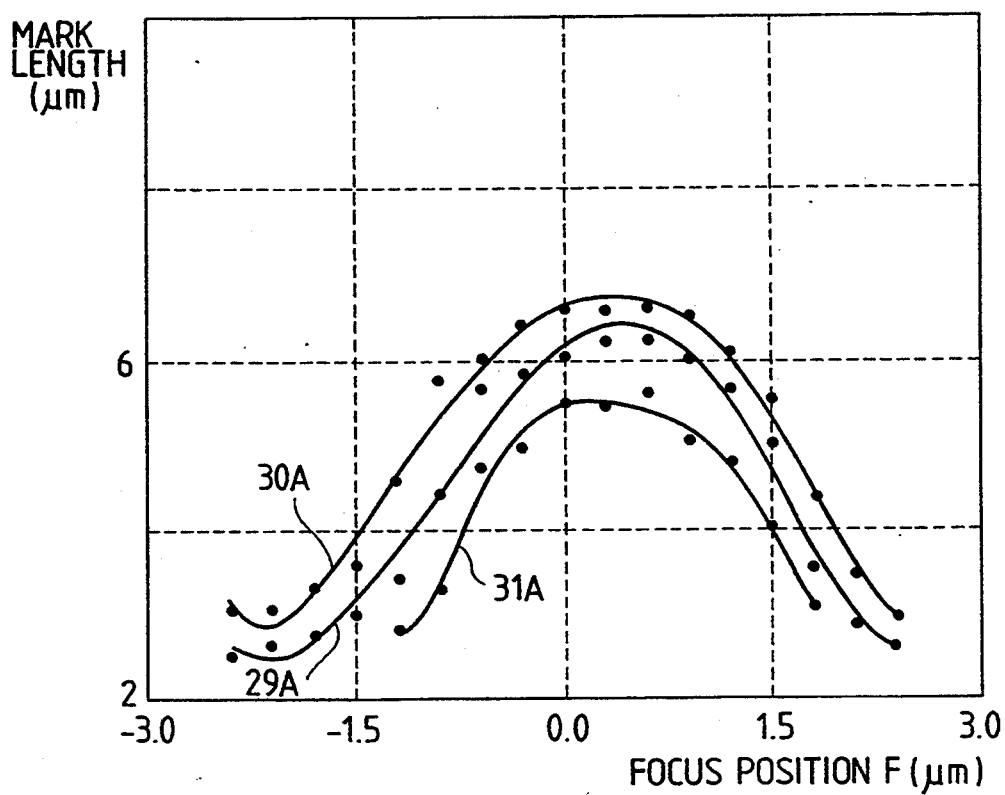
FIG. 3 is a graphic chart showing approximation functions obtained from results into which extraordinary values are eliminated from the actually measured values of the mark lengths of FIG. 2.

Further, referring to FIG. 10, a fluctuation width of the value of the best focus position is 0.05 μm or under, the best focus position being calculated by the method in this embodiment with the classification of the exposure energy into the three energies. Contrastingly, as already explained, according to the approximation curve of FIG. 3 which is obtained by removing the extraordinary value in accordance with the conventional method, the fluctuation width of the value of the best focus position is 0.6 μm. This value is larger than the result obtained by the method in this embodiment. Therefore, according to the method of calculating the best focus position in this embodiment, it can be understood that the best focus position can be calculated with an extremely higher accuracy and more favorable reproducibility than in the conventional examples.

Note that the calculation of the best focus position in the embodiment discussed above involves the following steps. The focus positions F4A, F4B exhibit, illustrated in, e.g., FIG. 8B, the mark length (M2−T) smaller by the fixed slice value T than the mark length maximum value M2. These focus positions F4A, F4B are searched on both sides of the focus position F3 exhibiting the maximum mark length. The mid-point between these focus positions F4A and F4B is set as the best focus position F4.

In this case, when the slice value T is fixed to a predetermined ordinary value, and if, for instance, the mark length is not smaller than the threshold value (M2−T), the best focus position is not calculated. Instead, the error is induced. A good way of preventing such an occurrence of error is to reduce the slice value T. If reduced excessively, however, there arises a drawback wherein the best focus position easily shifts due to a micro-change in the mark length in the vicinity of such a position that the mark length reaches the maximum value M2. Besides, if the mark length shifts due to the focus position asymmetrically with respect to the best focus position, and when the threshold value changes, it follows that the best focus position to be calculated also shifts.

The following is a thinkable method of reducing the error caused when calculating the best focus position described above and further deceasing the variations in the calculated value of the best focus position due to the changes in terms of the calculating condition.

To be specific, firstly, a settable range of the slice value T is limited. In the above-described embodiment, the slice value T takes a value on the order of 1 μm. It is, however, assumed that the slice value T can be set within a range of, e.g., approximately 0.5–2.0 μm. Further, the best focus position may be calculated by use of a plurality of slice values T1, T2, ... within the settable range. Then, if a calculation error is produced when using the first slice value T1, the calculation is conducted by employing the second slice value T2. The calculation may continue while changing the slice value till no calculation error is produced. Eventually, the accurate best focus position is thereby calculated.

Figure 11:
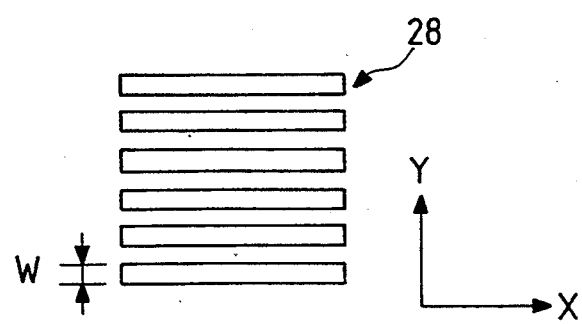
FIG. 11 is a plan view illustrating another example of the focus measuring mark image.

Note that the embodiment discussed above uses the focus measuring mark image 19P as shown in FIG. 6A, and, therefore, the best focus position is a focus position when the mark length is substantially maximized. A mark image 28 configured by, as illustrated in, e.g., FIG. 11, arranging rectangular patterns each having a width W in the Y-direction is used as a focus measuring mark image. In this case, however, the best focus position is a focus position when the Y-directional width of each rectangular pattern of the mark image 28 is substantially minimized.

Further, in the embodiment discussed above, the size of the focus measuring mark image is measured by the wafer alignment system incorporated into the stepper. The present invention is, however, similarly applied to a case where the best focus position is calculated from a result of measuring the size of the mark image by means of a scan type electronic microscope (SEM). When using the scan type electronic microscope, a defocus method is employed. According to the defocus method, a line width of each of resist patterns formed as a focus measuring mark image on the wafer is measured per focus position; and the best focus position is a focus position when a variation quantity of the measured line width is minimized.

In this instance, normally, the line width of the resist pattern increases as the focus position is defocused. Hence, the minimum value of the approximation function is obtained respectively in step 109 and step 113 of FIG. 5. Obtained respectively in step 110 and step 114 is a mid-point of the focus position, at which the approximation function becomes (the minimum value+the predetermined slice value). On the other hand, if the line width of the resist pattern is narrowed as the focus position is defocused, the maximum value of the approximation function is obtained respectively in step 109 and step 113 of FIG. 5. Obtained respectively in step 110 and step 114 is a mid-point of the focus position, at which the approximation function becomes (the maximum value−the predetermined slice value).

In this case also, the variation in the line width of the resist pattern becomes larger with a greater defocus quantity. It therefore follows that there increases an error of the line width due to a focus setting error when exposed. Accordingly, the approximation by the weighting least squares method used in the embodiment described above is effective.

Moreover, in accordance with the embodiment discussed above, the tentative best focus position is obtained in step 110. The weight $W_i$ is set based on the focus difference from this tentative best focus position. However, the tentative best focus position is not necessarily obtained. For example, the weight $W_i$ may be determined substantially in proportion to the actually measured value $D_i$ of the mark length. The actually measured value $D_i$ of the mark length of the mark image 19P of FIG. 6A becomes smaller with a longer distance from the best focus position. Hence, for example, even when the weight $W_i$ is determined substantially in proportion to the actually measured value $D_i$ of the mark length, a desirable weight $W_i$ can be obtained. As explained above, if the tentative best focus position is not employed, the actions of steps 108 through 110 of FIG. 5 are unnecessary.

As discussed above, the present invention is not limited to the above embodiments but may take a variety of configurations without departing from the gist and scope of the invention.

According to the present invention, the best focus position is obtained from the function approximated by the weighting least squares method. An advantage is therefore such that the best focus position can be calculated stably accurately without depending on the exposure conditions and the measuring conditions.

Further, in the second step, the first threshold value is determined with respect to the nth-order or larger function obtained in the first step. The tentative best focus position is an intermediate position between the positions in which the nth-order or larger function intersects the first threshold value. In the fifth step, the second threshold value is determined with respect to the nth-order or smaller function obtained in the fourth step. The best focus position of the projection optical system is an intermediate position between the positions in which the nth-order or smaller function intersects the second threshold value. In this case, the data with unstable values in the vicinity of the best focus position are not used at all, and, therefore, the best focus position can be obtained.

Furthermore, the nth-order or larger function obtained in the first step is the biquadratic or larger function relative to each focus position. The nth-order or smaller function obtained in the fifth step is the biquadratic or smaller function relative to each focus position. Particularly in this instance, the best focus position can be calculated stably accurately.

Then, in the first step, when the measuring mark image having a size in excess of the predetermined range is not employed for obtaining the nth-order or larger function, the extraordinary measuring data are eliminated. The best focus position can be therefore calculated accurately.

What is claimed is:

1. A method of measuring a best focus position of a projection optical system to arrange a photosensitive substrate at said best focus position of said projection optical system prior to a projection exposure of a mask pattern, the method comprising projecting images of a measuring mark onto said photosensitive substrate at a plurality of focus positions in an optical-axis direction of said projection optical system, said best focus position being calculated on the basis of a relationship between the respective focus positions and said images of said measuring mark which correspond to the focus positions respectively, said method comprising:
a first step of approximating a size of the measuring mark image with an nth-order or larger (n is an integer of 2 or larger) function relative to the focus position by a statistical operation;
a second step of obtaining a tentative best focus position from the approximated function;
a third step of calculating a weight corresponding to each of the plurality of measuring mark images on the basis of a difference between the tentative best focus position and each of the plurality of focus positions;
a fourth step of approximating a size of the measuring mark image with an nth-order or smaller function relative to the focus position by a statistical operation to minimize a sum, relative to the focus position, of product of the weight obtained in said third step by a square of a difference between the nth-order or smaller function relative to the focus position and the size of the measuring mark image corresponding thereto; and a fifth step of obtaining the best focus position of said projection optical system from the nth-order or smaller function obtained in said fourth step.

2. The method according to claim 1, wherein said second step comprises the substeps of:

determining a first threshold value with respect to the nth-order or larger function obtained in said first step; and obtaining, as the tentative best focus position, an intermediate position between positions in which the nth-order or larger function intersects the first threshold value, and wherein said fifth step comprises the substeps of:

determining a second threshold value with respect to the nth-order or smaller function obtained in said fourth step; and obtaining, as the best focus position of said projection optical system, an intermediate position between positions in which the nth-order or smaller function intersects the second threshold value.

3. The method according to claim 1, wherein the nth-order or larger function obtains in said first step is a biquadratic or larger function relative to each focus position, and the nth-order or smaller function obtained in said fifth step is a biquadratic or smaller function relative to each focus position.

4. The method according to claim 1, wherein said first step comprises the substep of:

obtaining the nth-order or larger function by deleting the measuring mark images having sizes which do not fall within a predetermined range.

5. A method of measuring a best focus position of a projection optical system, comprising:

a first step of arranging a photosensitive substrate respectively in a plurality of focus position in an optical-axis direction of said projection optical system and exposing predetermined measuring pattern on said photosensitive substrate through said projection optical system;

a second step of detecting a size of a plurality of measuring pattern images formed on said photosensitive substrate and, at the same time, approximating the size of the detected measuring pattern with a first function with the focus position being a variable; and a third step of effecting a statistical operation on the size of the plurality of measuring pattern images by use of a weight corresponding to a deviation between a tentative best focus position determined by the approximated first function and each of the plurality of focus positions and thus determining a second function representing a relationship between the size of the measuring pattern image and the focus position, wherein the best focus position of said projection optical system is determined from the second function.

6. The method according to claim 5, wherein said first function is an nth-order function (n is an integer of 2 or larger), and the second function is set to the nth-order or smaller function.

7. The method according to claim 6, wherein said third step comprises the substeps of:

calculating a weight given to each of the plurality of measuring pattern images and corresponding to a deviation between the tentative best focus position and each of the plurality of focus positions; and performing a statistical operation to minimize a sum with an addition of a product of the weight by a value of the square of a difference between a size predicted by the second function and the detected size in each of the plurality of pattern images.

8. The method according to claim 7, wherein said third step further comprises the substep of:

obtaining, as the tentative best focus position of said projection optical system, an intermediate position between focus positions in which the first function obtained in said second step intersects the predetermined threshold value.

9. The method according to claim 5, further comprising, before said second step, the steps of:

developing the photosensitive substrate exposed in said first step, wherein resist images of the measuring patterns formed on said photosensitive substrate through said developing step are detected in said second step.

10. A method of measuring a best focus position of a projection optical system, comprising the steps of:

arranging a photosensitive substrate respectively in a plurality of focus positions in an optical axis direction of said projection optical system and exposing predetermined measuring pattern on said photosensitive substrate through said projection optical system;

detecting a size of the plurality of measuring pattern images formed on said photosensitive substrate; and performing a statistical operation on a size of the plurality of measuring pattern images by use of a weight corresponding to the size of the measuring pattern images and thus determining a function representing a relationship between the size of the measuring pattern images and the focus position, wherein the best focus position of said projection optical system is determined from the function.

* * * * *